United States Patent
Shi et al.

(10) Patent No.: US 6,761,805 B1
(45) Date of Patent: Jul. 13, 2004

(54) CATHODE ARC SOURCE WITH MAGNETIC FIELD GENERATING MEANS POSITIONED ABOVE AND BELOW THE CATHODE

(75) Inventors: Xu Shi, Singapore (SG); Beng Kang Tay, Singapore (SG); Hong Siang Tan, Selangor (SG); David Ian Flynn, Crowborough (GB)

(73) Assignee: Filplas Vacuum Technology Pte. Ltd., Singapore (SG)

( * ) Notice: Subject to any disclaimer, the term of this patent is extended or adjusted under 35 U.S.C. 154(b) by 0 days.

(21) Appl. No.: 09/236,113

(22) Filed: Jan. 25, 1999

(Under 37 CFR 1.47)

Related U.S. Application Data

(63) Continuation-in-part of application No. 09/230,354, filed as application No. PCT/GB97/01992 on Jul. 24, 1997, now abandoned.

(30) Foreign Application Priority Data

Jul. 24, 1996 (GB) ............................................. 9615548

(51) Int. Cl.$^7$ ........................... H01J 37/32; C23C 14/00
(52) U.S. Cl. ........................... 204/192.38; 204/298.41; 204/298.12; 204/298.16; 204/298.19
(58) Field of Search ....................... 204/298.41, 298.12, 204/298.16, 298.19, 192.38; 315/111.81

(56) References Cited

U.S. PATENT DOCUMENTS

| | | | |
|---|---|---|---|
| 3,517,092 A | 6/1970 | Peterson | 264/29.5 |
| 5,279,723 A | 1/1994 | Falabella et al. | 204/192.38 |
| 5,458,754 A * | 10/1995 | Sathrum et al. | 204/192.38 |
| 5,468,363 A | 11/1995 | Falabella | 204/298.41 |
| 5,539,274 A | 7/1996 | Araki et al. | 313/362.1 |
| 6,026,763 A * | 2/2000 | Kim et al. | 204/298.41 |
| 6,103,074 A * | 8/2000 | Khominich | 204/298.41 |
| 6,413,387 B1 * | 7/2002 | Shi et al. | 204/192.38 |

FOREIGN PATENT DOCUMENTS

| | | |
|---|---|---|
| EP | 0 495 447 A1 * | 7/1992 |
| JP | 04124265 | 4/1992 |
| WO | WO 85/03954 | 9/1985 |
| WO | WO 89/01699 | 2/1989 |

OTHER PUBLICATIONS

V. Semenyuk et al. "Physical and Technological Features of the Arc Vacuum System for Coatings Deposition Based on the Plasma Arc Accelerator", 1996, XVIIth International Symposium on Discharges and Electrical Insulation in Vacuum, pp. 871–875.*

* cited by examiner

*Primary Examiner*—Gregg Cantelmo
(74) *Attorney, Agent, or Firm*—Sterne, Kessler, Goldstein & Fox P.L.L.C.

(57) ABSTRACT

A cathode arc source has means for generating first and second magnetic fields, of opposite or reverse direction to each other. The resultant magnetic field includes a null point between the target and the substrate, though close to the target. Field strength normal to the target is zero at the null point, and field strength lateral to the target is strong at the target surface, constraining movement of the arc spot and reducing the risk of migration off the target surface. A target is made by pressing graphite powder at elevated temperature and pressure in the absence of binding material. Both source and target contribute to reduced macroparticles in deposited films.

19 Claims, 9 Drawing Sheets

CATHODE ARC SOURCE WITH MAGNETIC FIELD GENERATING MEANS POSITIONED ABOVE AND BELOW THE CATHODE

This application is a Continuation-In-part of U.S. application Ser. No. 09/230,354, filed Jan. 24, 1999 now abandoned, which is a National Phase Application (371) of PCT/GB97/01992 filed Jul. 24, 1997, which claims priority to United Kingdom patent application No. 9615548.6, filed Jul. 24, 1996.

The invention relates to a cathode arc source, in particular a filtered cathode arc source. This invention also relates to a graphite target and to a method of making a graphite target, in particular, a graphite target for use in a filtered cathode arc source.

The source of the invention is suitable for use with or without filtering apparatus, in particular a double bend filter duct as previously developed and described in International patent application no. PCT/GB96/00389, published as WO-A96/26531 by the same inventors.

Filtered cathode arc sources are used, inter alia, to produce thin diamond-like films on substrates, the diamond originating from a graphite target.

An acknowledged problem in prior art sources is that their intense arc spots produce large quantities of macroparticles that contaminate the plasma generated from the target and, in turn, the deposited films. The problem of reducing the number of macroparticles in the films is conventionally addressed by provision between the target and the substrate of means for filtering macroparticles from the plasma beam.

Known commercial apparatus incorporates a 45 degree angle bend to filter macroparticles from the beam. Apparatus described by the present inventors in International patent application no. PCT/GB96/00389 describes a double bend filter duct for the same purpose. While this latter apparatus is particularly efficient, it is desirable to provide alternative means for reducing macroparticles in the deposited films.

U.S. Pat. No. 5,468,363 by Falabella discloses a specific arrangement of cathode, anode and first and second coils in a cathodic-arc source. Falabella specifies that the cathode is located in the centre of a short solenoid coil. That is to say, the cathode station at which a target may be located is located at the centre of a coil producing a first magnetic field.

In the Falabella source, movement of the arc spot about and away from the target surface is a problem and it is necessary, in an attempt to constrain the arc to the end of the cathode, to limit the source to targets having sloped sides.

It is known to prepare commercial graphite targets by gluing graphite powder with a binding material, such as bitumen, and then hot pressing under high temperature and pressure to graphitise and harden the target. A known graphite target is from PURE TECH INC., which has a density of about 1.8 g/cm$^3$. The use of this known graphite target produces a cathodic arc which is typically spot-like and uses a high current density. Using the known graphite target, a cathode arc spot usually has a diameter of about 1–10 cm. This type of arc spot produces a large amount of macroparticles which contaminate tetrahedral amorphous carbon (ta-C) films produced using known filtered cathode arc sources.

Another graphite target is made by Cambridge University and has a density of about 1.6 g/cm$^3$, pressed at about 200–250 MPa, at room temperature, using graphite having a particle size of about 1 micron ($10^{-6}$ m). In use, this target produces very little plasma and, consequently, a very low or zero rate of deposition after the filter section.

It has also been observed that using known graphite targets, the surface of the target is consumed in an uneven manner, as the arc spot moves erratically about the surface of the target. This movement of the arc on the surface of the target is uncontrollable and the deposition rate falls when the spot approaches the edge of the target.

SUMMARY OF THE INVENTION

The present invention seeks to provide a new design of cathode and anode and a new cathode target that, separately or in combination, eliminate or at least ameliorate some of the problems identified in the prior art. It is therefore an object of the invention to provide method and apparatus to generate an arc from a cathode target which in use emits fewer macroparticles compared to the prior art.

According to a first aspect of the invention there is provided a cathode arc source comprising a graphite cathode target and means for generating a magnetic field substantially normal to the target which has a point of zero field strength above the target surface.

In an embodiment of the invention, a cathode arc source for generating positive carbon ions from a cathode target, said ions being emitted in a direction substantially normal to a front surface of the cathode target, comprises a vacuum chamber and means for generating a magnetic field in the vacuum chamber, wherein the magnetic field has direction substantially normal to the front surface of the target and zero field strength at a position above the target and inside the vacuum chamber. The cathode arc source preferably comprises means for generating a first magnetic field proximal to the target and having a first field direction and means for generating a second magnetic field distal to the target and having a field direction opposite to that of the first magnetic field. The resultant magnetic field inside the vacuum chamber includes a point at which the field strength is zero in a direction substantially normal to the front surface of the cathode target.

Alternatively, the first and second magnetic fields are so positioned with respect to the target that the lateral field is enhanced in a region between the target and the substrate; the null point is preferably but not necessarily between the target and the substrate.

In use, the cathode arc source of the invention produces a beam of positive carbon ions having reduced numbers of macroparticles. The invention thus addresses the problem of how to remove macroparticles from a plasma of positive ions by control of a magnetic field, or a magnetic field resultant from two or more magnetic fields, within the vacuum chamber of the source so that fewer macroparticles are generated ab initio. Filtering of the plasma beam further to reduce macroparticles is an option and is a feature of preferred embodiments of the invention.

The invention thus addresses how to reduce macroparticle count at the point of macroparticle formation, rather than by removing them once formed.

In a particular embodiment of the invention, a cathode arc source for generating positive ions from a graphite cathode target comprises means for generating a magnetic field wherein:

(1) at a front surface of the target, field direction substantially normal to the front surface is towards the front surface;

(2) magnetic field strength in the direction substantially normal to the front surface decreases with increasing distance from the target to a point or region of zero field strength; and (3) from the point or region of zero normal field strength, with increasing distance from the target, field direction is away from the front surface of the target.

In this arrangement, positive ions emitted from a front surface of the target pass first through a magnetic field whose direction is substantially opposite to the direction of the positive ions, secondly through a point or region in which the magnetic field strength in that direction is zero and thirdly through a magnetic field whose direction is substantially the same as that of the positive ions. The latter field conveniently can be used to steer the positive ions, through filtering apparatus for example, towards a substrate.

Alternatively, the field at the front surface of the target is away from the target towards the substrate, then there is a point or region of zero normal field and distally from the front surface the field direction is then reversed, i.e. towards the target.

Hereafter, a point or region of zero field strength in a direction substantially normal to the front surface of the target is also referred to as a null point.

In a preferred embodiment of the invention there is provided a cathode arc source comprising a cooled graphite cathode target, a cooled anode, an arc power supply, a substrate, means for generating positive ions in an arc between the cathode and the anode and means for generating a magnetic field in a direction substantially normal to the cathode target which field has zero field strength at a position proximal to the target and located between the cathode target and the substrate. Optionally, between the position of zero field strength and the substrate the field direction is towards the substrate and between the position of zero field strength and the target the field direction is towards the target.

The desired magnetic field is conveniently resultant from two separate magnetic fields, one generated at or near the target and another at or near a position between the target and the substrate. Overlap of the two fields produces a null point through which positive ions pass en route to the substrate.

In use of this embodiment of the invention, an arc is struck at a graphite target while both first and second magnetic fields generating means are in operation. The arc in the resultant magnetic field is not as intense as in prior art sources but is instead diffuse, producing few if any of the so-called "red flies" that are characteristic of known cathode arc sources.

In another particular embodiment of the invention, there is also provided means for varying the strengths of the one or both of the respective magnetic fields so as to vary the position of zero normal field strength. Such an arrangement is convenient for adjustment of the distance between the front surface of the target and the null point.

The cathode arc source of a preferred embodiment comprises two magnetic field generating coils. The first coil is located above the target, and in use is between the target and the substrate. Such a magnetic field coil is conventionally found in filtered cathode arc sources as it provides a magnetic field to steer plasma produced from the target through filtering apparatus, that may for example comprise a single or a double bend and other filtering structures such as baffles, and towards the substrate. The field generated by the coil, substantially normal to the cathode target, has its direction away from the target and towards the substrate. This cathode arc source also comprises a second magnetic field coil located below the target, that is to say the other side of the target from the substrate. This second coil generates a magnetic field substantially co-axial with but in a direction opposite from that generated by the first coil. The effect is that the field produced by the second coil partially counterbalances the field produced by the first coil such that, by adjustment of the relative field strengths, at a point above the target the normal field has a null point.

As the current in the respective coils is varied so the null point, that is to say the point of zero field in a direction substantially normal to the front surface of the target, moves further away from or further towards the surface of the target.

It has been found that while the respective coil currents are varied so as to move the zero point in the normal field above the cathode target, the strength of the lateral field above the target surface, that is to say the field in a direction substantially lateral or parallel to the front surface of the target, stays within acceptable boundaries.

Typically, the first coil generates a magnetic field of a steady strength of around 50 mT. As current in the second coil is varied between 5 A and 20 A, the strength of the resultant field is measured in a lateral direction, and found to be between about 15 mT and 35 mT. Despite this specific observation, the invention is for use with conventional arc power supplies and is not limited to particular field strengths but applies generally to cathode arc sources having crossed or reversed fields or otherwise providing a magnetic field with a null point between target and substrate.

It is further observed that the strength of the resultant magnetic field, produced by variation in strength of the counterbalancing field, affects both arc behaviour and deposition rate. As the null point approaches close to the target, the arc becomes more intense and is located closer to the target, a strong blue plasma is seen and there is a decrease in the deposition rate. As the null point moves far away from the target, the strength of the magnetic field at the target surface increases and sustaining the arc and striking the arc become problematic. There is also seen a decrease in deposition rate. Further, it is observed that ta-C film is deposited onto the target and onto the wall of the vacuum chamber. Once this occurs, re-striking of the target is virtually impossible as it is covered with ta-C film, insulating the target from the arc current.

The null point is therefore chosen so as to be at an intermediate position, producing an arc having a diffuse arc flame and reduced arc spot intensity. For different arc source set-ups , finding suitable operating parameters may take some trial and error or calibration. Using a graphite target of 60 mm diameter and a toroidal duct of 12 cm (6 inches) diameter, a magnetic field of about 50 mT above the target and about 60 mT in the reverse direction below the target, the null point is about 5 cm above the front surface of the target, and blue plasma giving a useful deposition rate is obtained. Few "red flies" are observed in this arc, and the target is eroded evenly. While arc current is flowing, a "hump", being an area concentrated in positive ions, forms above the target surface. Most positive ions are accelerated back towards the target surface, which is at a negative potential typically of about −30 volts, impinging upon the target surface with high energy and perpetuating the arc. Current flows as atoms on the surface of the target are disassociated into ions and electrons—which flow to the anode which is grounded and therefore at zero volts. A typical arc current is about 100 A and at this current the plasma current, i.e. the positive ions that form the plasma beam may have a current of about 1 A. Thus, the current that goes to forming the plasma beam of positive ions is a very low proportion of the total arc current.

Alteration in the strength of the bottom magnetic field, under the target, produces corresponding variation in the location of the null point. If the null point is too close to the target surface then more electrons flow directly from the cathode to the anode at a position level with the null point. Therefore there is much less plasma output. If the null point is chosen correctly then a column of plasma is produced giving good rates of deposition of virtually macroparticle-free coatings.

The location of the second coil in the source of the invention is significant because it has a advantageous effect upon the strength of the lateral field at the surface of the target.

In the source described by Falabella the cathode is at the centre of the coil and, in use, at the surface of the cathode the field is nearly parallel. That is to say, the normal field perpendicular to the target will be strong and the lateral field strength will be almost zero. By contrast, in use of the source of the invention, the lateral field strength at the surface of the target is relatively high. This is illustrated in the results shown in FIG. 5 of the drawings, which illustrates lateral magnetic field strength against distance from the target surface. In the embodiment illustrated in use, at the target surface, i.e. zero cm from the target surface, the lateral field strength varies between about 15 and 35 mT for a current in the coil varying between 5 A and 20 A.

In the source of preferred embodiments of the present invention, the cathode and coils are located so that the target surface is above the second coil, ie the second coil is below the target surface. Preferably, the second coil is at least 1 cm below, more preferably at least 2 cm. The result of so locating a magnetic field coil, which could be replaced by another field generating means, below the target surface is that there is thereby a significant lateral field component to the magnetic field at the target surface, and this lateral (sometimes referred to as radial) component helps to maintain the arc spot on the surface of the target during operation. Consequently, it is a significant advantage that the arc spot will tend to remain on a flat target and the target does not have to be of a specific shape as in the prior art. Using the source of the invention, target erosion tends to be relatively even, and a relatively large, disk-like target can be used for long periods of operation and during which operation the position of the arc remains roughly in the same place.

In the preferred embodiments of the invention, by providing a lateral field at the target surface, the arc spot tends to be constrained as it moves around the target surface, and target utilisation is improved in that it tends to be more even and the arc spot tends to migrate less of the top of the target.

In the source of a specific embodiment of the invention, an inner surface of the vacuum chamber is an anode. With this design, the source of the invention does not need the hollow annular anode seen for example in the prior art to Falabella. Furthermore, the invention avoids use of a hollow annular anode and reduces risk of a short circuit between the target and the anode. This short circuit can occur in prior art apparatus as the arc spot travels to that point on the target where the distance between the target and the anode is the shortest.

In the source of the specific embodiment of the invention, there is no additional annular anode, and the short circuit described above is less likely to occur because of the increased space between the cathode and the anode, whereby the electric field is more gently distributed. As a result, operation of the source of the invention tends to result in more stable output of plasma to form a coating on the substrate, and at a higher level of output.

The plasma beam produced by this cathode arc source can subsequently be filtered using conventional single or double bend ducts. Magnetic steering of the plasma beam is achieved because the plasma beam follows the field lines of the magnetic field as is well known in the art.

At the null point, the field strength substantially normal to the target is zero and there is a strong lateral field. The normal field strength is measured in the centre of the plasma beam. The lateral field strength is measured along the cylindrical wall of the anode. In use, the walls of the chamber in which the cathode arc source is located are typically coated with carbon flakes, which glow at the point associated with a strong lateral field, so visual observation of the position of the zero normal field, i.e. the null point, can readily be made through a view-port.

In an embodiment of the invention, an arc source comprises a cathode located substantially centrally with a vacuum chamber. An Inner surface of the chamber is grounded as an anode which thus surrounds the cathode and extends away from the cathode along the inner wall of the chamber. A graphite target is in electrical contact with the cathode and, to prevent arcing between the cathode (rather than the target) and anode, an electrically insulating shroud surrounds the cathode. It is preferred that distances from the outer edges of the target to the anode are substantially the same all the way round the target—for example, this is achieved by provision of a substantially circular target, centrally positioned within a cylindrical anode. In addition, the edge or edges of the target are optionally shrouded so that an arc is formed only between the anode and a front surface of the target.

To prevent any overheating damaging the equipment, cooling is typically provided by a water cooled jacket around the anode and in which inlet of cold water occurs adjacent to the null point so as to provide maximum cooling where the anode is most heated. Water flows into the cooling jacket approximately level with the null point and flows up an inner spiral, subsequently flowing down an outer portion of the jacket and up an inner spiral until it exits via an exit pipe. Water cooled anodes are known in the art, though these anodes typically have diameters similar to the target diameter. Current in magnet field coils above and below the target are adjusted so that both the null point and also the water inlet are approximately the same distance above the target surface.

Existing filtered cathode arc sources may be modified according to the invention by addition of a second magnetic field coil at or below the target and having a reverse direction to that of the steering magnetic field coil already present. In existing sources it is often found that the target need be located at a significant distance from the coils of the magnetic steering field in order for arc striking and maintenance to be achieved. The invention, using a reversing field around the target, decouples arc generation from plasma steering. The target can be closer to the magnetic steering field coil and strong steering fields can be used without affecting arc generation.

The first aspect of the invention also provides a method of striking an arc at a graphite cathode target comprising:

(i) generating (a) a first magnetic field having a first field direction and (b) a second magnetic field having a second field direction opposite to that of the first, so as to generate a magnetic field that is resultant from the first and second fields; and (ii) striking the arc in the resultant field.

The first and second magnetic fields can be generated from coils located, respectively, above and below the target, and the first coil optionally forms part of means for filtering macroparticles from plasma produced by the arc by steering the plasma through a single or double bend duct. As described above, the resultant field includes a null point above the target at which point field strength normal to the target is zero, and variation in the coil currents varies the distance of the null point from the target.

A second aspect of the invention, suitable for use separately or in combination with the arc source of the first aspect of the invention relates to a graphite target.

Accordingly, a second aspect of the present invention provides a target comprising graphite powder of average size greater than 2 microns pressed under elevated temperature and pressure. Its typical density is in the range 1.7–2.0 g/cm$^3$; this target is for use in a cathode arc source.

Preferably, the density of the target is in the range 1.8–1.95 g/cm$^3$. The graphite target of the invention is typically made using graphite having average particle size of about 5–20 microns, by pressing the graphite powder at 400–620 MPa at least 150° C., preferably at 230° C.+/–30° C. Preferably, the target is pressed at 450–600 MPa, most preferably at 500–600 MPa.

The graphite powder is pressed in the substantial absence of binding material so that the resultant target has a porous structure that traps gas within its pores or cells. When used in conventional cathode arc sources, or arc sources according to the first aspect of the invention, a plasma beam of positive ions is obtainable with reduced emission of contaminating macroparticles. This property is believed to be due to release of small amounts of gas from within the pores of the target into the arc, which gas aids ionisation in the arc spot. The inventors do not, however, wish to be bound by this theory. For coating applications in which a small amount of gas in the film can be tolerated, the target is thus of advantage as it reduces macroparticles in the film.

In a particular embodiment of the invention, the target is pressed at about 550 MPa, giving a target density of around 1.9 g/cm$^3$. This target is pressed in air at about 230° C. In comparative tests, a target pressed using similar size graphite particles and at the same pressure but at room temperature generates a softer target which in use produces a plasma beam having increased macroparticles. The invention thus relates also to a graphite target produced by the method of the invention. The size and shape of the target can be adjusted according to fit into any filtered cathode arc source, though a typically sized target is circular in cross section having a diameter of 20 mm–100 mm, preferably 40 mm–80 mm.

In a specific embodiment of the invention to be described hereafter, the cathode target is prepared from graphite powder having average particle size of about 10 microns (325 mesh), and has a density of 1.8–1.9 g/cm$^3$.

In use of the graphite target of the invention, it is observed that the cathode spot produced on the surface of the target is more diffuse than when using prior art targets. It is also observed that the cathode spot on the graphite target of the invention has a larger size than when using prior art targets, and is typically around 1–5 mm in diameter, more specifically around 3 mm in diameter. It is an advantage of the invention that using the graphite target produces a cathode spot that emits fewer macroparticles which would contaminate the film deposited using the filtered cathodic arc source. Use of the graphite target thus results in cleaner films. It is also observed that, using the graphite target of the invention, a filtered cathodic arc source can be operated using a lower current density, and, further, that deposition of diamond-like films from the graphite target can be obtained efficiently at a high vacuum pressure in the filtered cathode arc chamber. It has further also been observed that the cathode target of the invention is consumed uniformly.

The invention also provides a method of making a graphite target for use in a cathode arc source, the method comprising pressing graphite powder, in the absence of binding material, at a pressure of 400–620 MPa and a temperature of 130–330° C. to form a solid target.

It is preferred that the graphite powder is pressed at a pressure of 450–620 MPa, more preferably 520–600 MPa. It is further preferred that the pressing temperature is 180–280° C., more preferably 200–260° C.

In an embodiment of the invention, there is provided a method of making a graphite target comprising:

providing a mould in which the target is to be formed;

placing graphite powder free of binder In the mould;

pressing the powder into the mould at a pressure of about 550 MPa and a temperature of about 230° C. to form a target; and releasing the target from the mould.

A typical mould is one that produces a cylindrical shaped target, typically having a diameter in the range of 40–100 mm, though other target shapes such as square, triangular are appropriate according to their proposed use.

In another embodiment of the invention, there is provided a method of making a graphite target further comprising pre-heating the graphite powder in an oven at a temperature of 100–400° C. The period of heating is optionally between ½ and 10 hours and in a specific embodiment of the invention described below, the graphite powder is pre-heated for about 6 hours in an oven at about 300° C.

In use of prior art soft targets, such as that developed by Cambridge University, it has been observed that the arc spot drills a hole through the target surface; the hole typically being about 1 mm in diameter and leading to target cracking after 1 or 2 uses. In use of the prior art PURE TECH INC target, it has been observed that the arc forms a tiny arc spot on the surface of the target, which moves quickly about the surface giving uneven wear. In use of the target of the invention the arc spot is observed to move more slowly around the surface of the target, not to generate a hole in the target surface, but instead to wear the surface of the target in a more even fashion.

It is an advantage of the present invention that the cathode arc source produces a plasma beam having significantly reduced levels of macroparticles. It is further an advantage of the invention that the target itself when used in combination with the cathode arc source of the invention further reduces the number of macroparticles in the emitted plasma.

The invention is now described in the following specific examples which are not to be construed as limiting the scope of the invention, and illustrated by drawings in which:

DETAILED DESCRIPTION

Figure 1:
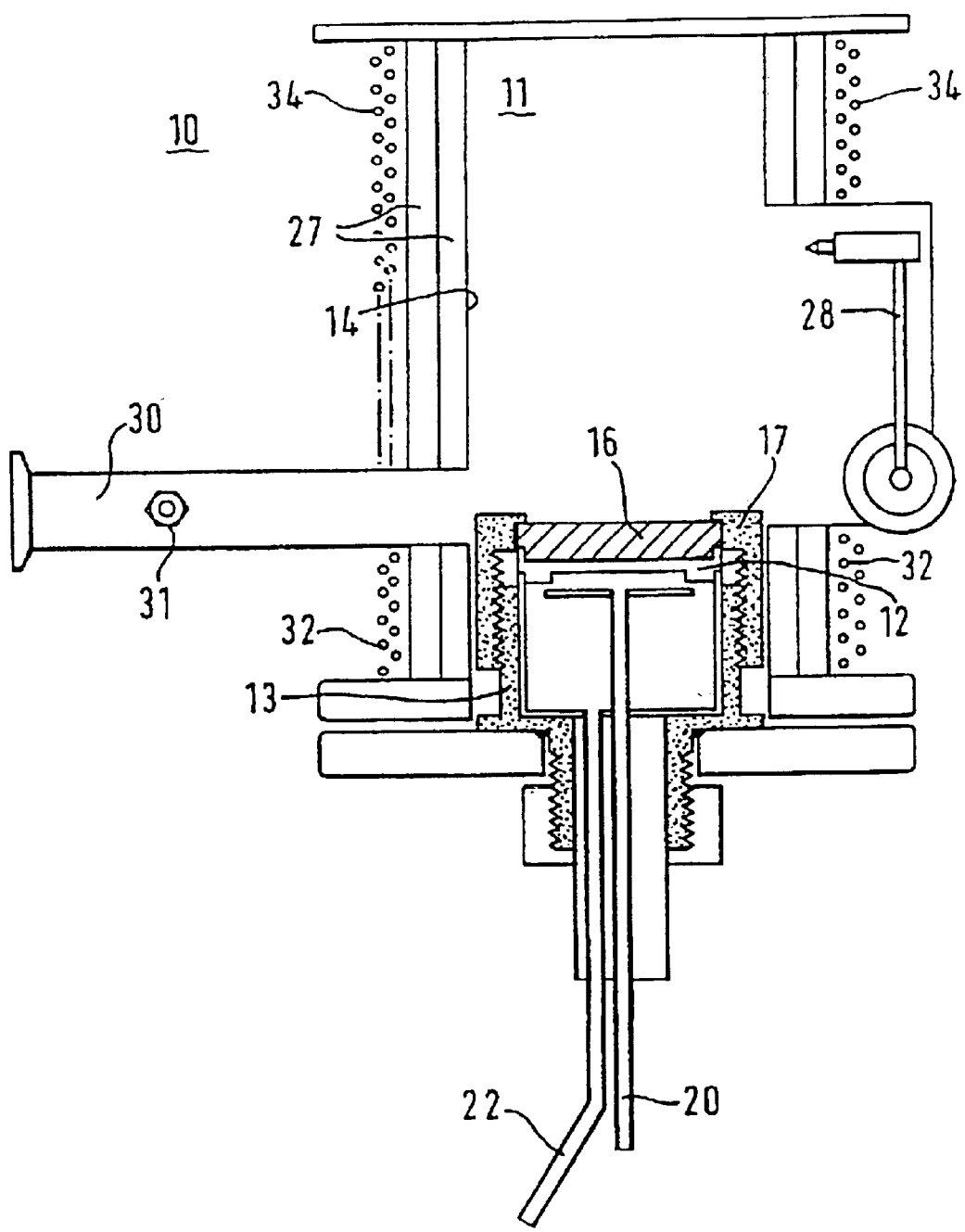
FIGS. 1 and 2 show, respectively, front and side cut-away views of a cathode arc source of the invention.
Figure 2:
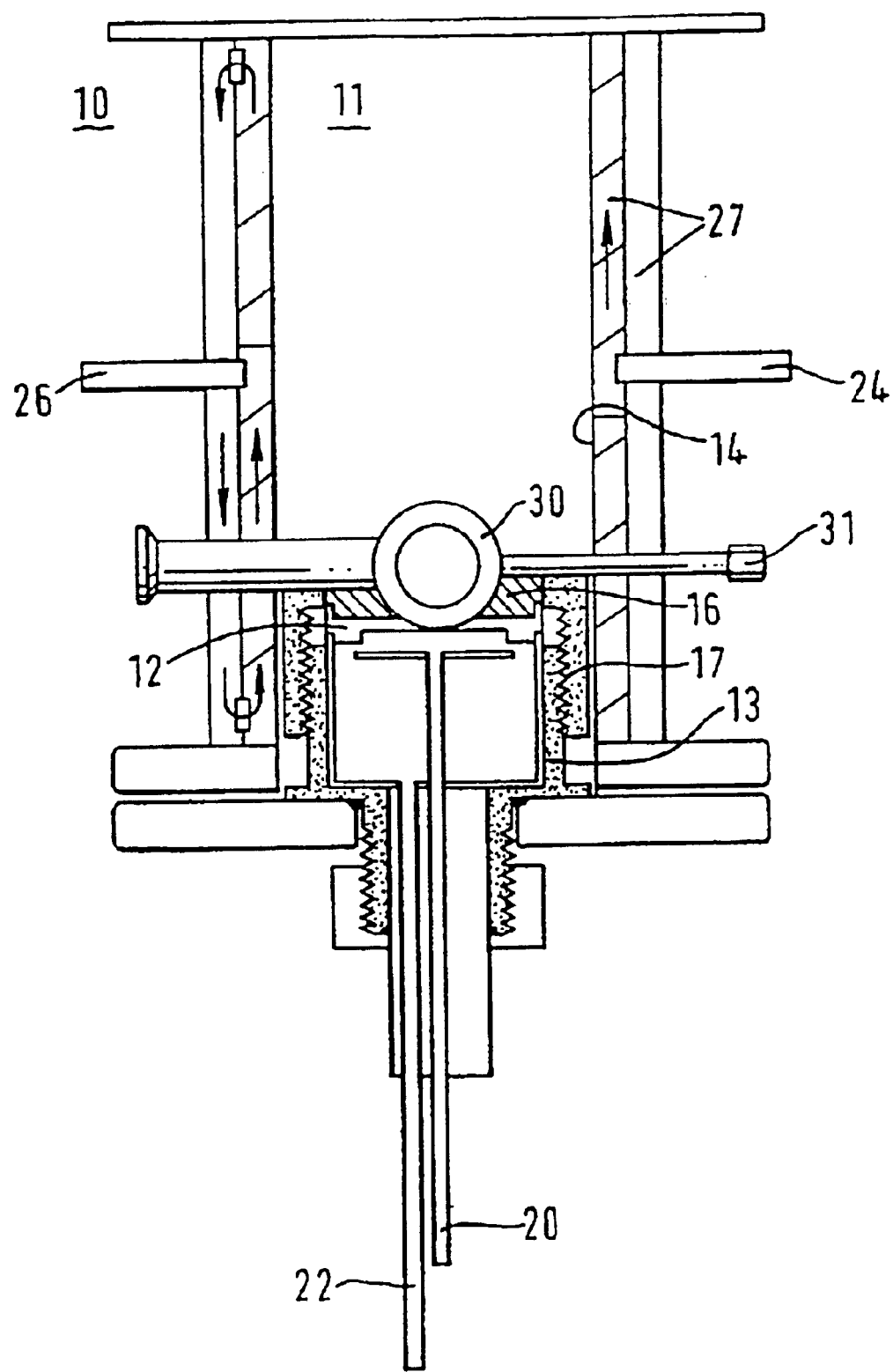
Figure 3:
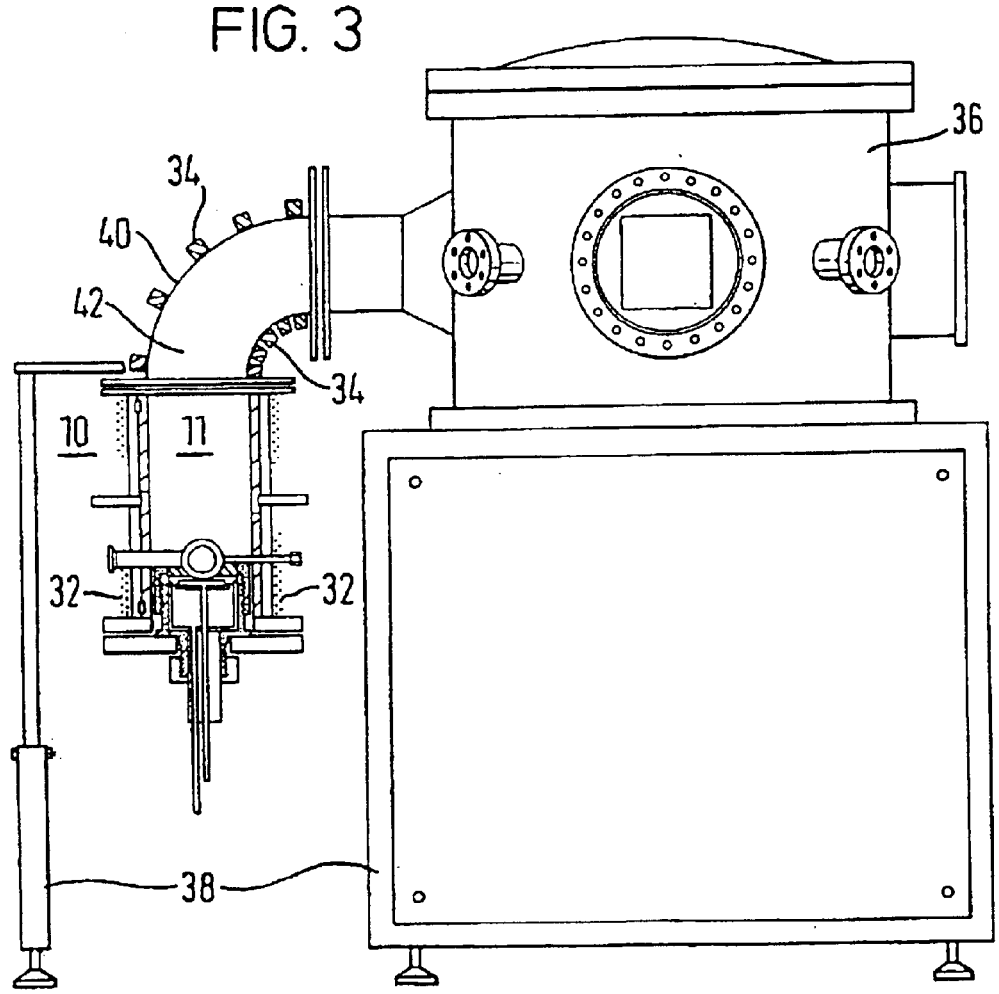
FIG. 3 shows a side view of a cathode arc source of the invention as part of deposition apparatus and connected to a deposition chamber.

Referring to FIGS. 1, 2 and 3, a cathode arc source (10) is shown generally in FIGS. 1 and 2 and connected to a deposition chamber (36) in FIG. 3.

The source (10) comprises a cathode (12) shrouded by a non-insulating shroud (13) and an anode (14) that is formed by the inside wall of the vacuum chamber (11). A target (16) is in electrical contact with the cathode (12). An insulating shroud (17) surrounds the target to prevent arcing between sides of the target (16) and the anode (14). The cathode (12) and the anode (14) are connected to an arc power supply (not shown).

Cooling of the cathode is achieved via supply of cooling water via water inlet (20) and water outlet (22). Cooling of the anode Is likewise achieved by supply of cooling water via water inlet (24) and water outlet (26). Water that cools the anode passes through a 3-layered cooling jacket (27) with flow of cooling water in the direction indicated by arrows on FIG. 2.

A rotatable striker (28) is mounted on the wall of the vacuum chamber and is adapted to rotate towards and contact the target (16) to achieve ignition of the cathode arc.

A view port (30) including a swagelock fitting for gas input (31) is mounted on the side of the source for visible inspection of the arc during operation.

Below the target (16) there is a first magnetic coil (32, shown in FIG. 1 and not shown in FIG. 2) and mounted above the target (16) and around the cylindrical wall of the chamber is a second magnetic coil (34, shown in FIG. 1 and not shown in FIG. 2). In operation of the cathode arc source (10) magnetic fields are generated by the respective coils (32, 34) and a resultant magnetic field is produced within the vacuum chamber (11) such that, about 2–4 cm above the target, in which there is a point of zero field strength in a direction substantially normal to the target (16). The point of zero field strength, or "null point", is within the vacuum chamber (11) and a short distance above the target (16). Variation of the currents in the respective coils (32, 34) will vary the distance between the surface of the target (16) and the null point. In FIG. 3 the windings of the second coil (34) extend to the walls (40) of a toroidal duct (42) leading to deposition chamber (36) which is mounted on support structure (38). If increased steering field is needed then field coils (34) can be supplemented by permanent magnets on the outside of the bend (not shown).

Figure 4:
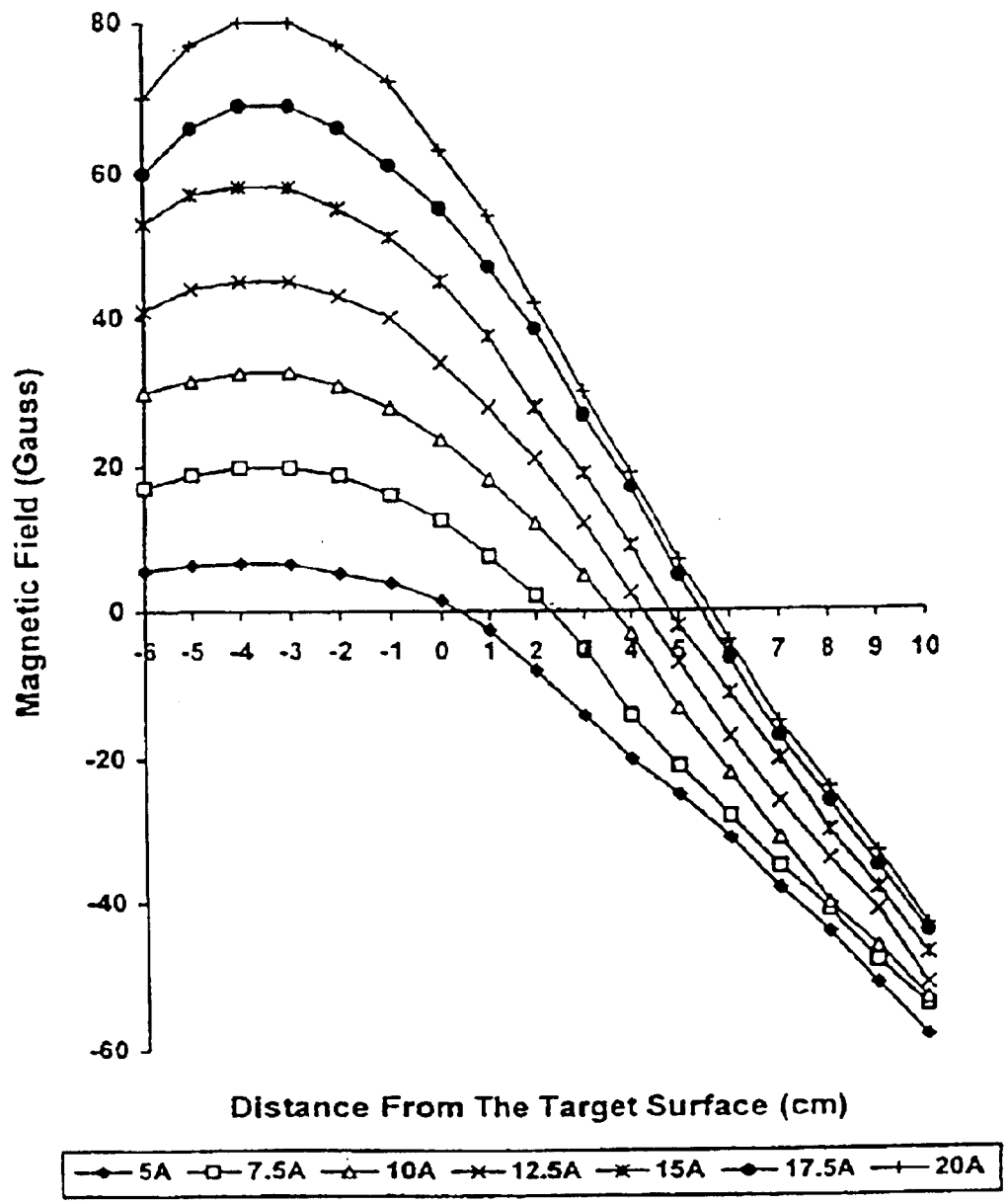
FIG. 4 is a graph of magnetic field strength in a direction substantially normal to the target in a cathode arc source of FIG. 1, the field strength measured at the centre of the beam of ions emitted from the target.
Figure 5:
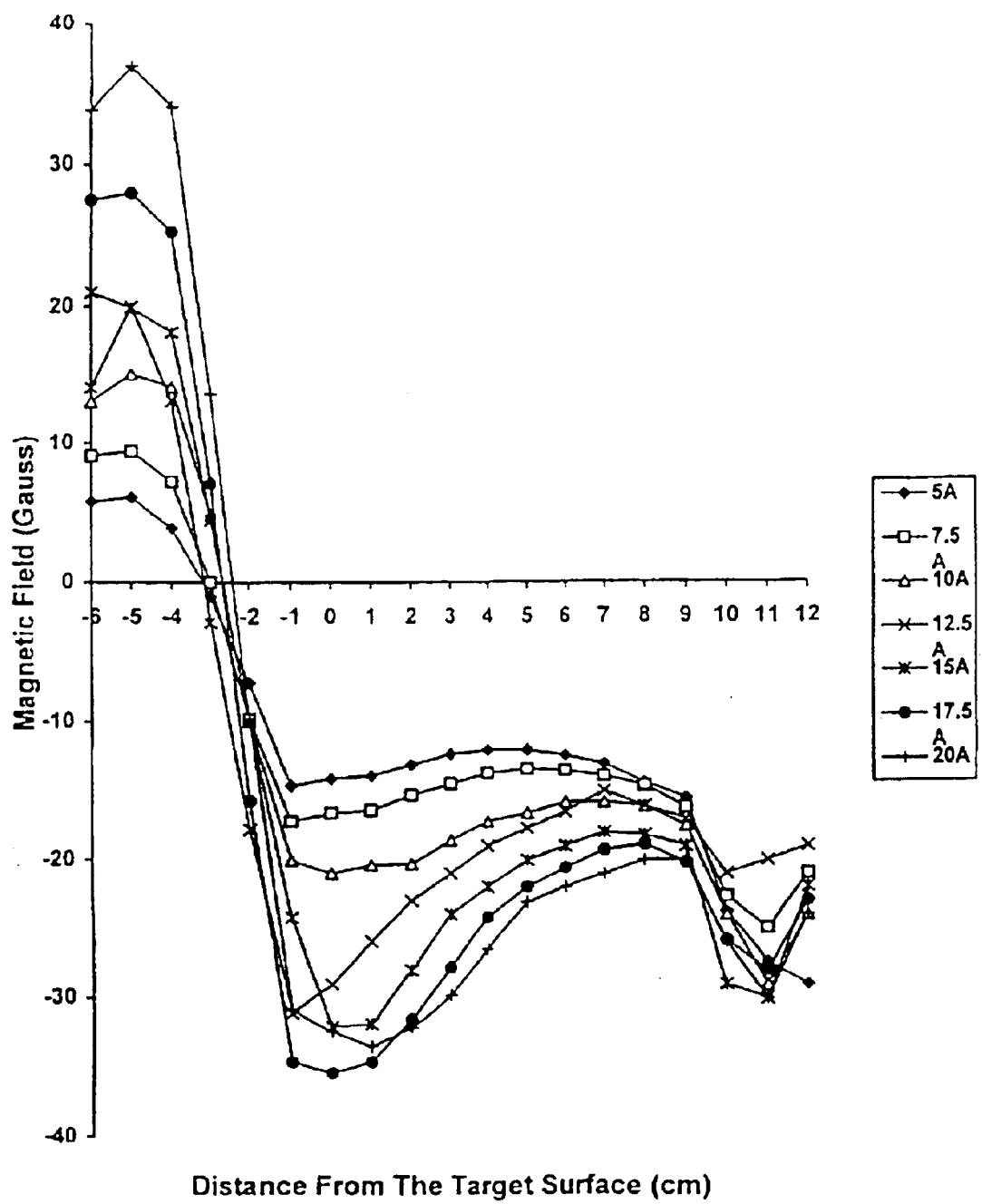
FIG. 5 is a graph of magnetic field strength in a direction substantially lateral to the target in a cathode arc source of FIG. 1, the field strength measured at the cylindrical walls of the anode.

In use of this cathode arc source, the currents in the respective first and second coils (32, 34) are varied such that the null point, i.e. the point at which the magnetic field in a direction substantially normal to the target has zero strength, is between 0.5 cm and about 6 cm away from the target (16). During operation of the cathode arc source the magnetic field generated by the coil located above the target (34) was kept constant and providing a magnetic field with strength about 50 mT and the current in the coil located below the target (32) was varied between 5 A and 20 A and the resultant fields in the normal and the lateral directions were measured. The results are shown on FIGS. 4 and 5. In FIG. 4 it is seen that as the current in the coil below the target is increased from 5 A through increments of 2.5 A and up to 20 A, so the position at which the normal magnetic field has zero strength increases from about 0.5 cm above the target surface to above 6 cm above the target surface. FIG. 5 shows the results of measuring the strength of the field in a direction lateral to the target and measured at the anode wall (14) of the source. The results in FIG. 5 show that the strength of the lateral field varies between about 15 mT, when the current in the coil below the target is 5 A and the null point is about 0.5 cm above the target surface, and about 25 mT when the current in the coil below the target is 20 A and the null point is about 6 cm above the target surface. Referring to FIGS. 4 and 5, while these figs illustrate the results of measurement of field strength using the coil currents specified for the coil below the target, it will be appreciated by a person of skill in the art that further variations in the coil current, maintaining a null point in the normal field inside the vacuum chamber and above the target, can also be adopted during use of the cathode arc source.

EXAMPLE 1

Graphite powder suitable for preparing a graphite target was placed in an oven and heated at 250 degrees C. for about 5 hours. The powder was removed from the oven and pressed, free of binders such as bitumen or tar, into a mould at a temperature of about 230° C. and pressure of about 550 MPa, this pressure being maintained for a period of about 30 minutes.

The resultant graphite target had a density of about 1.9 $g/cm^3$ and was cylindrical, having a diameter of 60 mm.

Using this graphite target in a filtered cathode arc source we observed that the diameter of the cathode spot on the surface of the target was approximately 5 mm in diameter. Whereas using prior art graphite targets, an intensely bright spot and "red flies" are typically seen at the cathode. Very few "red flies" were observed using the new target. Instead, the spot is bluish in colour and the plasma has a similar blue colour.

The inventors have thus found that a porous graphite target, pressed under less extreme conditions then in the art, gives rise to an arc that is diffuse to an approximate, typically size of 10 mm. This diffuse arc results in use of a much lower current density and produces significantly fewer macroparticles in the emitted beam of plasma.

EXAMPLE 2

Graphite powder having a particle size of about 10 microns diameter was pressed, again free of binder material, into graphite targets at a temperature of about 230° C. and a compress pressure of about 80, 120, 250, 310, 420 and 520 MPa. The deposition rate was tested in a filtered cathode arc source having a double bend filter duct and substantially as described in PCT/GB96/00389. The results are shown in FIG. 6.

Figure 7:
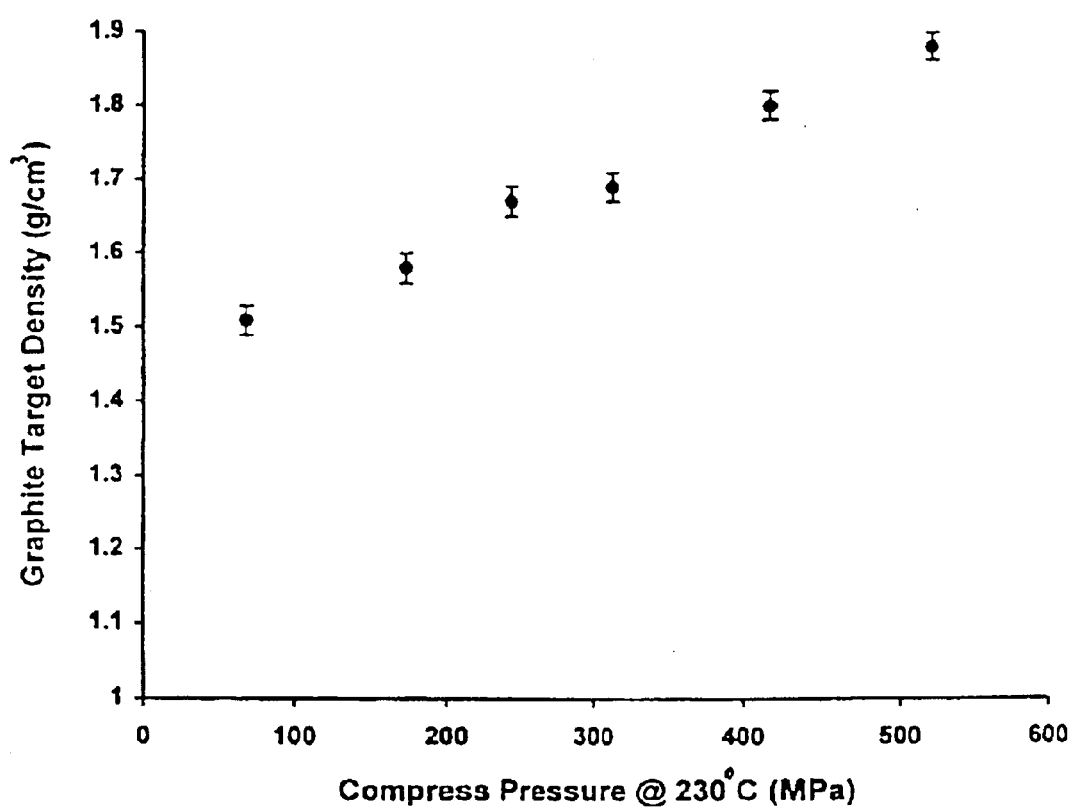
FIG.7 is a graph showing target density against pressure of pressing graphite powder into a target.

Further targets were made by pressing graphite powder of size approximately 10 microns in diameter at a temperature of 230° C. and at compress pressures of about 80, 180, 250, 310, 420 and 520 MPa. The density of these targets was measured and the results are illustrated in FIG. 7.

Figure 6:
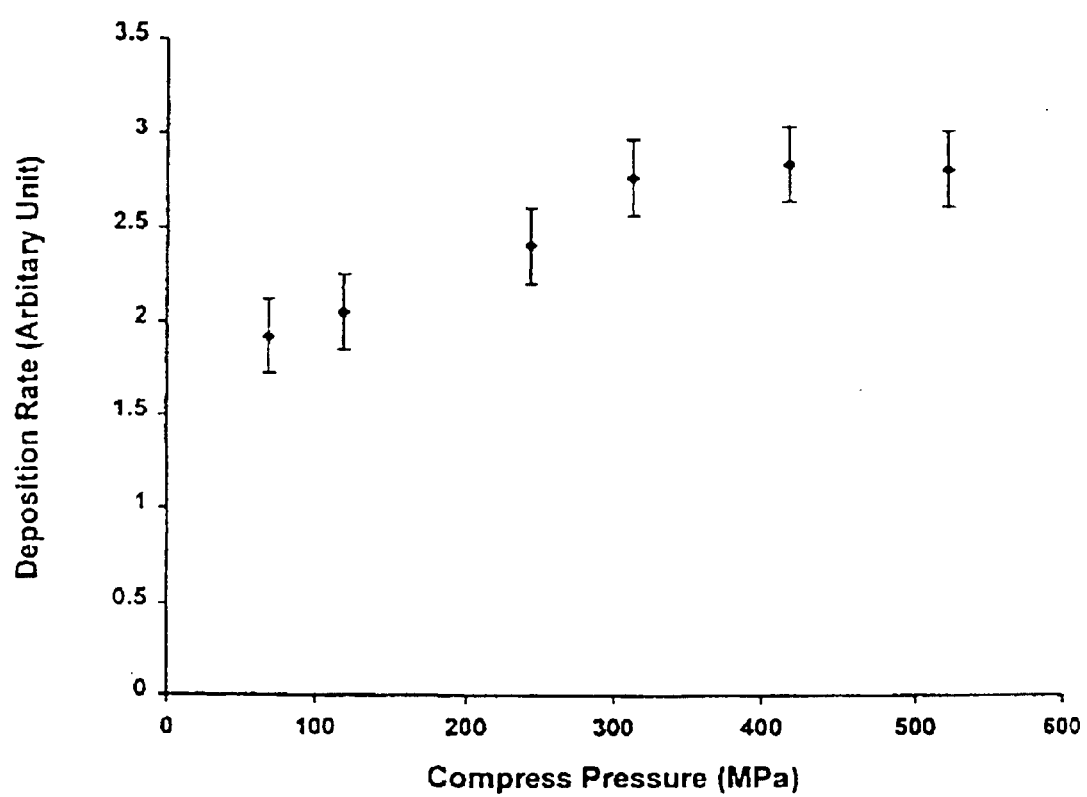
FIG. 6 is a graph showing rate of deposition of ta-C film against pressure of pressing graphite powder into a target.

FIG. 6 illustrates that targets obtained using a compress pressure of about 250 MPa or above produced the highest deposition rates. The density of graphite targets produced in this pressure range, as shown in FIG. 7, is around 1.7–1.9 g/cm³. Thus, a graphite target made according to the invention produces advantageous-results in terms of lower macroparticle count while not sacrificing deposition rate.

EXAMPLE 3

Using the cathode arc source of the invention, we investigated the characteristics of an arc produced using a commercially available target and using a target of the invention.

Figure 8:
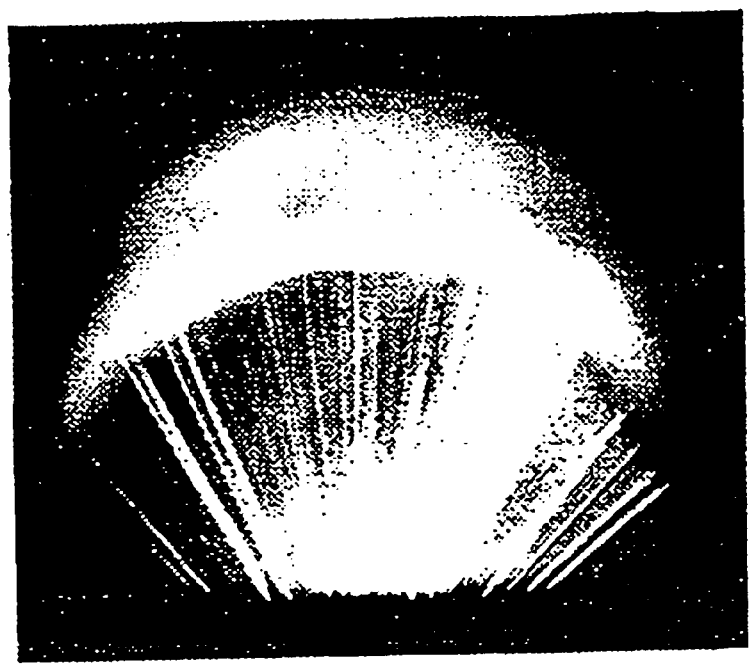
FIG. 8 is a photograph of an arc generated using a commercially available graphite target.
Figure 9:
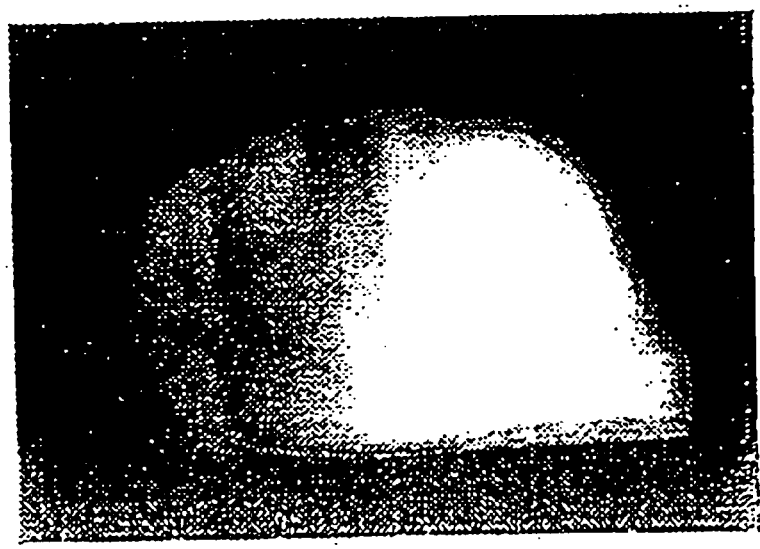
FIG. 9 is a photograph of an arc generated using a graphite target according to the invention.

The arcs generated were photographed via the view point and the results are shown in FIGS. 8 and 9. FIG. 8 is the arc produced from a commercial graphite target. Numerous red flies are visible as bright streaks in the photograph. These red flies are indicative of macroparticles formed in the arc.

In FIG. 9 the arc is virtually free of red flies and has a much more uniform appearance then when the arc is generated from the commercial target.

Figure 10:
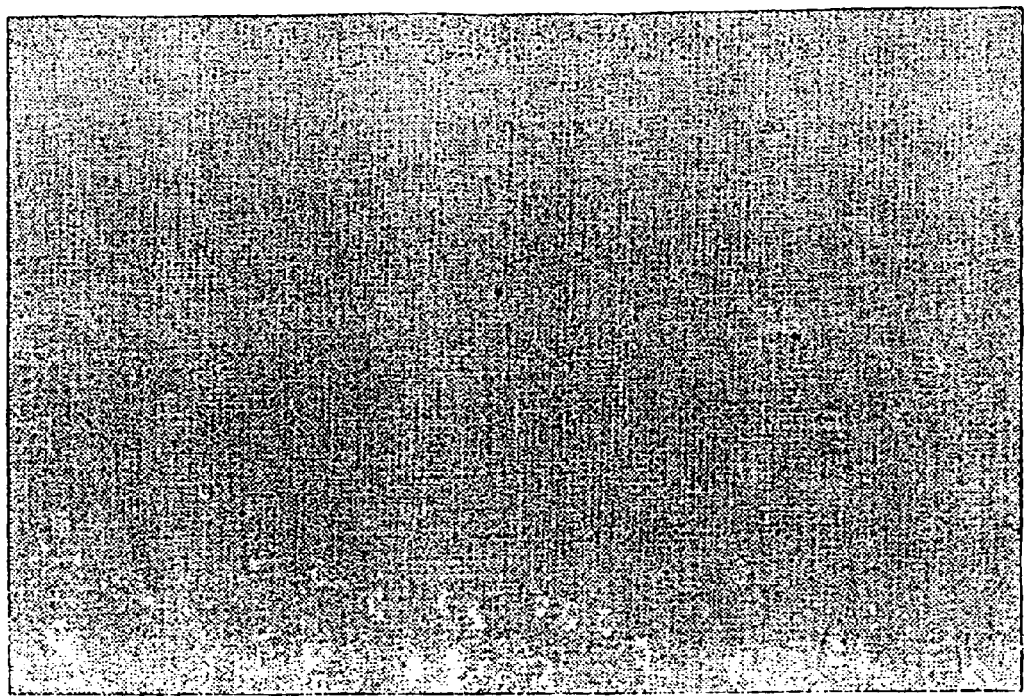
FIG. 10 is a photograph of a ta-C film deposited using a commercially available graphite target (magnification×500)
Figure 11:
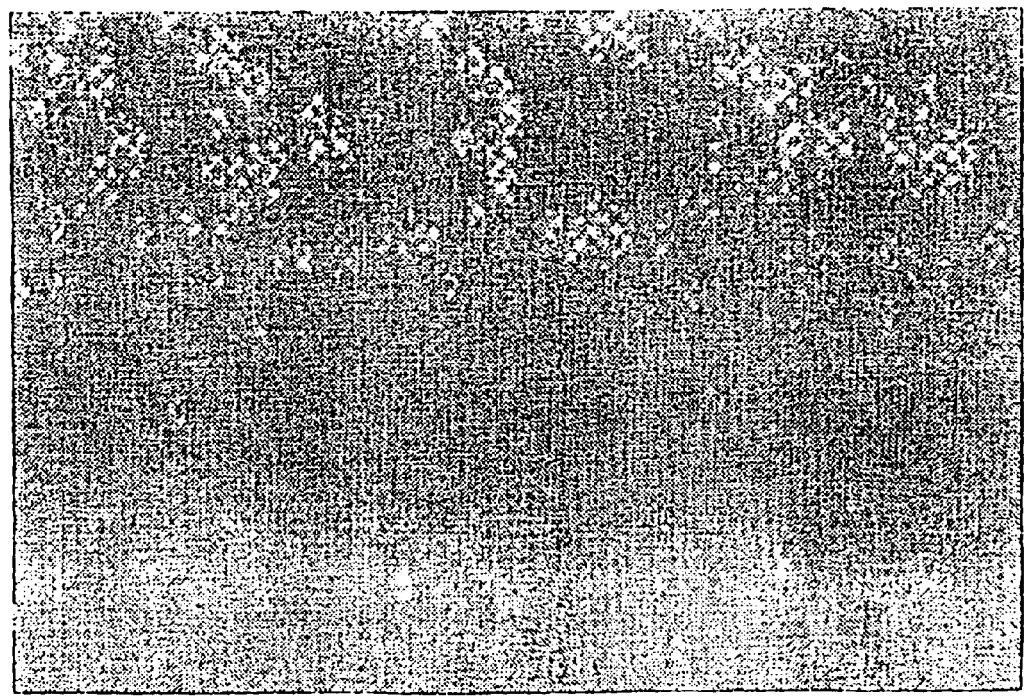
FIG. 11 is a photograph of a ta-C film deposited using a graphite target of the invention (magnification×500).

Films of ta-C were deposited using both the commercially availably target and the target of example 1. FIG. 10 shows a photograph magnified 500 times of the film produced using the commercially available target. A number of blemishes are visible, indicating macroparticles in the film. The number of macroparticles seen is significantly less than when a ta-C film is produced using a commercially available target and in a commercially available cathode arc source. FIG. 11 shows a photograph magnified 500 times of a ta-C film produced using a target according to the present invention in a cathode arc source according to the present invention. The film is free of macroparticles.

The invention enables production of thin films, such as diamond-like films, containing fewer macroparticles, and has wide industrial application, for example hard disc drive and semiconductor manufacture and in coating optical elements.

What is claimed is:

1. A cathode arc source for generating positive carbon ions from a cathode target, said ions being emitted in a direction substantially normal to a front surface of the target, comprising:
   a cathode;
   an anode;
   a vacuum chamber;
   a macroparticle filter; and
   a magnetic field generating means, wherein said magnetic field generating means is arranged to generate a magnetic field in the vacuum chamber, wherein the magnetic field has a direction substantially normal to the front surface of the target and zero field strength at a position above the target and inside the chamber, the magnetic field being the resultant of fields generated by a first field generating means located above the target and a second field generating means located below the target.

2. A source according to claim 1 wherein an inner surface of the chamber is an anode.

3. A source according to claim 2 wherein said magnetic field generating means comprises means for generating a first magnetic field proximal to the target and having a first field direction and means for generating a second magnetic field distal from the target and having a field direction substantially opposite to that of the first magnetic field.

4. A source according to claim 2 wherein:
   at the front surface of the target, the field direction substantially normal to the front surface is towards the front surface;
   magnetic field strength in said direction decreases with increasing distance from the target to a point of zero field strength substantially normal to the front surface; and
   from said point of zero field strength, with increasing distance from the target, the field direction is away from the front surface of the target.

5. A source according to claim 2 wherein:
   at the front surface of the target, the field direction substantially normal to the front surface is away from the front surface and towards the substrate;
   magnetic field strength in said direction decreases with increasing distance from the target to a point of zero field strength substantially normal to the front surface; and
   from said point of zero field strength, with increasing distance from the target, the field direction is towards the front surface of the target.

6. A source according to claim 2 wherein said magnetic field generating means comprises means for generating a magnetic field which has a zero field strength in a direction substantially normal to the target and a lateral field strength of 15 mT to 35 mT.

7. A source according to claim 2 wherein at the point of zero field strength in a direction substantially normal to the target, a field strength in a direction substantially lateral to the target is at least 10 mT.

8. A source according to claim 7 wherein the point of zero normal magnetic field is located between 2 and 6 cm above the surface of the target.

9. A source according to claim 1 further comprising means for generating a radial electric field to focus positive ions generated from the source into a beam.

10. A cathode arc source comprising:
    a cathode;
    an anode;
    a vacuum chamber;
    a macroparticle filter;
    a magnetic field generating means, wherein said magnetic field generating means is arranged to generate a magnetic field in the vacuum chamber;
    a cathode station for location of a target in electrical contact with the cathode, said target having a front and a rear surface; and
    means for striking an arc at the front surface of the target, wherein the magnetic field is located at the front surface of the target and wherein the magnetic field has a lateral field component effective to maintain the arc on the front surface of the target during operation and a normal field component with a direction substantially normal to the front surface of the target and zero field strength at a position above the target and inside the chamber.

11. A method of striking an arc at a graphite cathode target in a vacuum chamber comprising:
    (i) generating (a) below the target, a first magnetic field having a first field direction and (b) above the target, a second magnetic field having a second field direction opposite to that of the first, so as to generate a magnetic field that is resultant from the first and second fields, wherein said resultant magnetic field has a direction substantially normal to a front surface of the target and zero field strength at a position above the target and inside the chamber; and
    (ii) striking the arc in the resultant field.

12. A method according to claim 11 wherein the arc is struck between a cathode and an anode formed by an inner surface of the vacuum chamber.

13. A method according to claim 11 comprising varying coil current in means for generating the first or second magnetic fields so as to vary the resultant field to optimize arc striking.

14. A method according to claim 11 further comprising using the second magnetic field to steer plasma from the arc through a macroparticle filter.

15. A method according to claim 11 wherein the first and second fields are substantially co-axial.

16. A method according to claim 15 wherein the first and second fields are substantially co-axial with plasma emitted from the arc.

17. A method of depositing carbon ions from a cathode target onto a substrate in a vacuum chamber, comprising the steps of:
  (i) generating (a) below the target, a first magnetic field having a first field direction and (b) above the target, a second magnetic field having a second field direction opposite to that of the first, so as to generate a magnetic field that is resultant from the first and second fields, wherein said resultant magnetic field has a direction substantially normal to a front surface of the target and zero field strength at a position above the target and inside the chamber;
  (ii) striking an arc in the resultant field; and
  (iii) depositing carbon ions onto the substrate.

18. The method of claim 17 wherein the step of generating the first and second magnetic fields comprises the step of varying coil current in means for generating the first or second magnetic fields so as to vary the resultant field to optimize arc striking.

19. The method of claim 17 further comprising the step of using the second magnetic field to steer plasma from the arc through a macroparticle filter.

* * * * *